(12) United States Patent
Song

(10) Patent No.: US 6,972,483 B1
(45) Date of Patent: Dec. 6, 2005

(54) SEMICONDUCTOR PACKAGE WITH IMPROVED THERMAL EMISSION PROPERTY

(75) Inventor: Ho Uk Song, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/973,169

(22) Filed: Oct. 26, 2004

(30) Foreign Application Priority Data

Jun. 30, 2004 (KR) .................. 10-2004-0050059

(51) Int. Cl.$^7$ ............................................. H01L 23/48
(52) U.S. Cl. .................. 257/690; 257/734; 257/737; 257/738
(58) Field of Search ................ 257/734–739, 257/718, 678, 679, 690, 698, 700, 705, 706, 257/720; 438/106, 121

(56) References Cited

U.S. PATENT DOCUMENTS

| | | | |
|---|---|---|---|
| 6,879,030 B2 * | 4/2005 | Tsai et al. | 257/680 |
| 2004/0016999 A1 * | 1/2004 | Misumi | 257/678 |
| 2005/0098870 A1 * | 5/2005 | Thomas et al. | 257/690 |

* cited by examiner

Primary Examiner—Anh D. Mai
Assistant Examiner—Nathan W. Ha
(74) Attorney, Agent, or Firm—Ladas & Parry LLP

(57) ABSTRACT

Disclosed is a semiconductor package capable of improving a thermal emission property. The semiconductor package includes a substrate having a window, a first wiring, and a second wiring. A semiconductor chip is attached to the substrate. A metal pattern is formed at a pad-forming surface of the semiconductor chip. A first metal wire connects the bonding pad to a first bond finger and a second metal wire connects the metal pattern to a second bond finger. A sealing member is provided to seal the substrate. A first solder ball is attached to a first ball land and a second solder ball is attached to the second ball land.

6 Claims, 4 Drawing Sheets

SEMICONDUCTOR PACKAGE WITH IMPROVED THERMAL EMISSION PROPERTY

BACKGROUND OF THE INVENTION

1. Field of the Invention

The present invention relates to a semiconductor package, and more particularly to a semiconductor package having an FBGA (Fine-pitch Ball Grid Array) structure with an improved thermal emission property.

2. Description of the Prior Art

Generally, semiconductor packages have been developed to improve an electrical characteristic thereof while decreasing a size thereof. An example of such semiconductor package is a BGA package. Since a whole size of such BGA package is similar to a size of a semiconductor chip, a mounting space for the BGA package can be minimized. In addition, the BGA package is electrically connected to an external circuit by a solder ball, so an electrical signal transmission path can be minimized, so that the BGA package has an improved electric characteristic.

Recently, as semiconductor devices are highly integrated, an FBGA (Fine-pitch BGA) achieving a fine-pitch of a signal/power input/output pin in addition to such merits of the BGA package has been proposed.

FIG. 1 is a sectional view showing a conventional face-down type FBGA package.

As shown in FIG. 1, a semiconductor chip 1 of a center pad type is attached to an upper surface of a substrate 5 having a substrate window by an adhesive tape 3 such that bonding pads 1a of the semiconductor chip 1 extend downward. The bonding pads 1a of the semiconductor chip 1 exposed by the substrate window are connected to a bond finger (not shown) of the substrate 5 by a metal wire 7 passing through the substrate window. An upper surface of the substrate 5 including the semiconductor chip 1 and a window portion of the substrate 5 including the metal wire 7 are sealed by a sealing member 9 consisting of EMC (Epoxy Molding Compound). The solder ball 11 is attached to a ball land (not shown) of a substrate wiring (not shown) in order to allow the substrate 5 to be mounted on a PCB (Printed Circuit Board).

However, as the semiconductor chip has large capacity with a high operational speed, the conventional package including above-mentioned FBGA package has a problem in that an operational characteristic thereof is deteriorated due to an increase of a junction temperature caused by heat generated during an operation of the conventional package.

Accordingly, it is necessary to provide a semiconductor chip having large memory capacity with high operational speed. For instance, DDR2 is equipped with a face-down type FBGA structure, so it is necessary to solve a problem of an inferior operational characteristic caused by heat.

SUMMARY OF THE INVENTION

Accordingly, the present invention has been made to solve the above-mentioned problems occurring in the prior art, and it is an object of the present invention to provide a semiconductor package capable of preventing an operational characteristic of a semiconductor chip from being deteriorated due to heat generated during an operation of the semiconductor chip.

Another object of the present invention is to provide a semiconductor package having large capacity with a high operational speed by improving a thermal emission property of the semiconductor package.

In order to achieve the above objects, there is provided semiconductor package comprising: a substrate formed at a center thereof with a window, and formed on one side thereof with a first wiring including a first bond finger and a first ball land and a second wiring including a second bond finger and a second ball land; a semiconductor chip attached to an other side of the substrate in a face-down type through an adhesive tape, and provided at a center thereof with a plurality of bonding pads; a heat-emission metal pattern formed at a surface of the semiconductor chip, in which the bonding pads are formed, such that the bonding pads are exposed, and formed such that a predetermined portion of the bonding pad adjacent to the heat-emission metal pattern is exposed through a window of the substrate; a first metal wire extending by passing through the window of the substrate in order to electrically connect the bonding pad of the semiconductor chip to a first bond finger of the first wiring of the substrate; a second metal wire extending by passing through the window of the substrate in order to electrically connect the heat-emission metal pattern to a second bond finger of the second wiring; a sealing member for sealing the other side of the substrate including the semiconductor chip and the window of the substrate including the first and second metal wires; a first solder ball attached to a first ball land of the first wiring of the substrate in order to allow the semiconductor chip to be mounted on a PCB; and a second solder ball attached to an upper surface of the second ball land of the second wiring of the substrate in order to emit heat.

According to the preferred embodiment of the present invention, a thickness of the heat-emission metal pattern is about 1~100 μm.

The heat-emission metal pattern includes a metal having superior thermal conductivity, and has a multi-layer structure having a Cu layer or an Al layer.

The heat-emission metal pattern covers the semiconductor chip except for a center portion of the semiconductor chip including the bonding pad.

The heat-emission metal pattern includes an Ag-plating layer or an Au-plating layer at a predetermined portion thereof to which the second metal wire is connected.

BRIEF DESCRIPTION OF THE DRAWINGS

The above object, features and advantages of the present invention will be more apparent from the following detailed description taken in conjunction with the accompanying drawings, in which.

DETAILED DESCRIPTION OF THE PREFERRED EMBODIMENTS

Hereinafter, preferred embodiments of the present invention will be explained with reference to the accompanying drawings.

Figure 1:
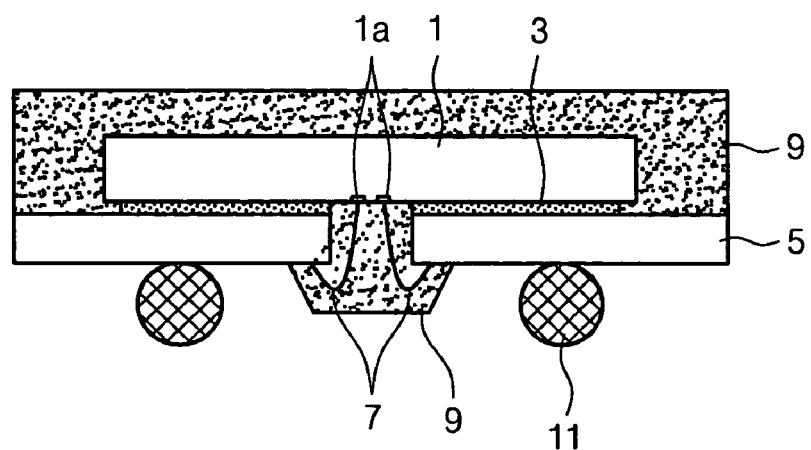
FIG. 1 is a sectional view showing a conventional face-down type FBGA package.
Figure 2:
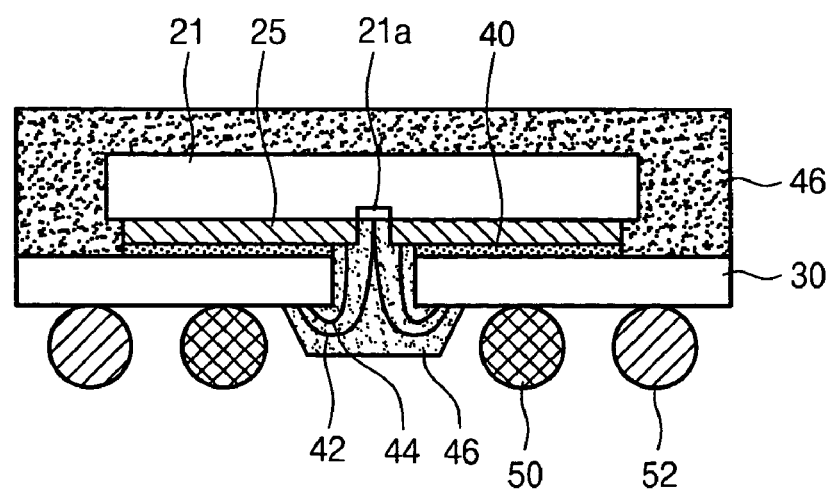
FIG. 2 is a sectional view showing a semiconductor package having an FBGA structure according to one embodiment of the present invention.

FIG. 2 is a sectional view showing a semiconductor package having an FBGA structure according to one embodiment of the present invention.

As shown in FIG. 2, a center pad type semiconductor chip 21, in which a plurality of bonding pads are aligned in series at a center portion thereof, is formed at a pad forming surface thereof with a metal pattern 25 for emitting heat, and is attached to the other side of a substrate 30, which is formed at a center thereof with a window, by an adhesive tape 40 in a face-down manner.

Herein, the metal pattern 25 for emitting heat is attached to the semiconductor chip 21 such that a center portion of the semiconductor chip 21 including a bonding pad 21a can be exposed. An end part of the metal pattern 25 adjacent to the bonding pad 21a is exposed through a substrate window. The substrate 30 is formed at one side thereof with bond fingers (not shown) aligned adjacent to the window and wirings (not shown) having a ball land and connected to each bond finger, which will be explained later in detail with reference to drawings.

In addition, bonding pads 21a of the semiconductor chip 21 are connected to a first bond finger of the substrate 30 by means of a first metal wiring 42 passing through the substrate window, and an end part of the metal pattern 25 for emitting heat is connected to a second bond finger of the substrate 30 by means of a second metal wiring 44 passing through the substrate window.

The other side of the substrate 30 including the semiconductor chip 21 and a substrate window part including first and second metal wirings 42 and 44 are sealed by a sealing member 46.

An external circuit, for example, a first solder ball 50 allowing the semiconductor chip 21 to be mounted on a PCB is attached to a first ball land of a first wiring connected to the bonding pad 21a of the semiconductor 21. In addition, a second solder ball 52 for emitting heat, which acts as a thermal emission path, is attached to a second ball land of a second wiring connected to the metal pattern 25 for emitting heat.

According to the semiconductor package of the present invention having the above structure, the thermal emission path including the metal pattern for emitting heat is newly added to the conventional FBGA structure, so heat generated during an operation of the semiconductor chip can be rapidly emitted to an exterior. Accordingly, the semiconductor package according to the present invention can efficiently prevent an operational characteristic of the semiconductor chip from being deteriorated due to heat generated during an operation of the semiconductor chip. As a result, the present invention can provide the semiconductor package having large capacity with a high operational speed.

FIGS. 3a to 3c and FIGS. 4a to 4c are views showing manufacturing steps of a semiconductor package according to one embodiment of the present invention. Hereinafter, the manufacturing process for the semiconductor package will be described with reference to FIGS. 3a to 3c and FIGS. 4a to 4c. Herein, FIGS. 3a to 3c and FIGS. 4a to 4c are upside-down views of FIG. 2.

Figure 3A:
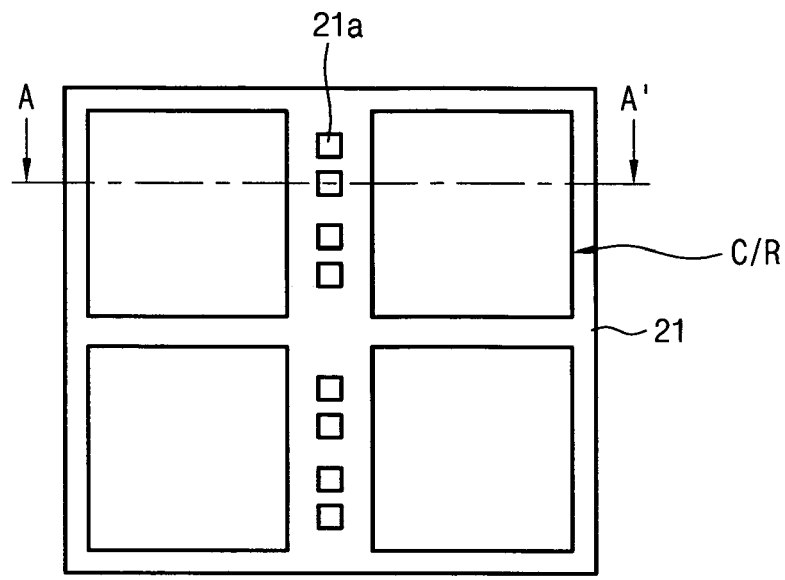
FIGS. 3a to 3c are plan views showing manufacturing processes of a semiconductor package according to one embodiment of the present invention.
Figure 4A:
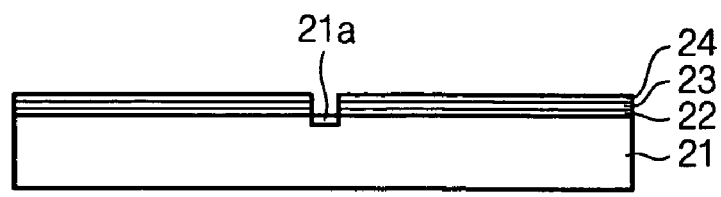
FIGS. 4a to 4c are sectional views taken along line A-A' shown in FIGS. 3a to 3c.

Referring to FIGS. 3a and 4a, a semiconductor chip 21 formed at a center thereof with a plurality of bonding pads 21a aligned in series and having a plurality of memory cell array regions (hereinafter, simply referred to as "core region": C/R) formed through a conventional fabrication process is prepared.

Herein, the semiconductor chip 21 includes a first insulation layer 22, a second insulation layer 23, and a stress buffer layer 24, which are sequentially formed on an upper surface of the semiconductor chip 21 and patterned such that the bonding pad 21a is exposed to an exterior. At this time, the stress buffer layer 25 includes a metal layer having superior thermal conductivity, such as Cu and Al, and a seed metal layer attached to the second insulation layer 23 with great adhesive force and allowing the metal layer having superior thermal conductivity to be subject to an electrolytic plating process.

Figure 3B:
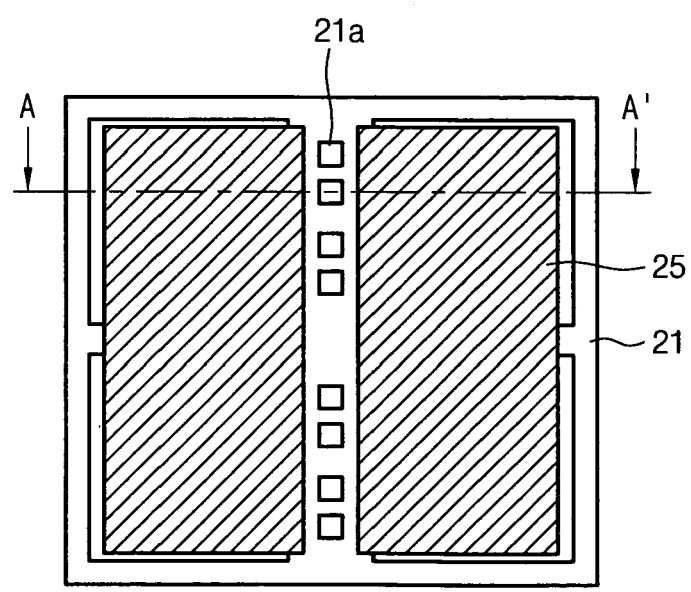
Figure 4B:
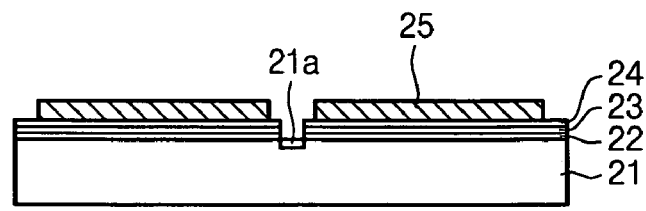

Referring to FIGS. 3b and 4b, a metal pattern 25 for emitting heat is formed on the whole upper surface or on a part of the semiconductor chip 21 by using a wafer level technique such that the bonding pad 21a is exposed. At this time, the metal pattern 25 for emitting heat has a thickness of about 1~100 $\mu$m, and is aligned such that a center of the semiconductor chip 21 including the bonding pad 21a can be exposed to the exterior. That is, the metal pattern 25 is aligned to both sides of the center of the semiconductor chip 21 including the bonding pad 21a. In addition, the metal pattern 25 for emitting heat may form an Ag plating layer or an Au plating layer (not shown) on a predetermined upper portion thereof adjacent to the bonding pad 21a of the semiconductor chip 21 such that wire bonding work can be easily performed.

Meanwhile, the first insulation layer 22, the second insulation layer 23, and the stress buffer layer 24 shown in FIG. 4a are omitted in FIG. 4b.

Figure 3C:
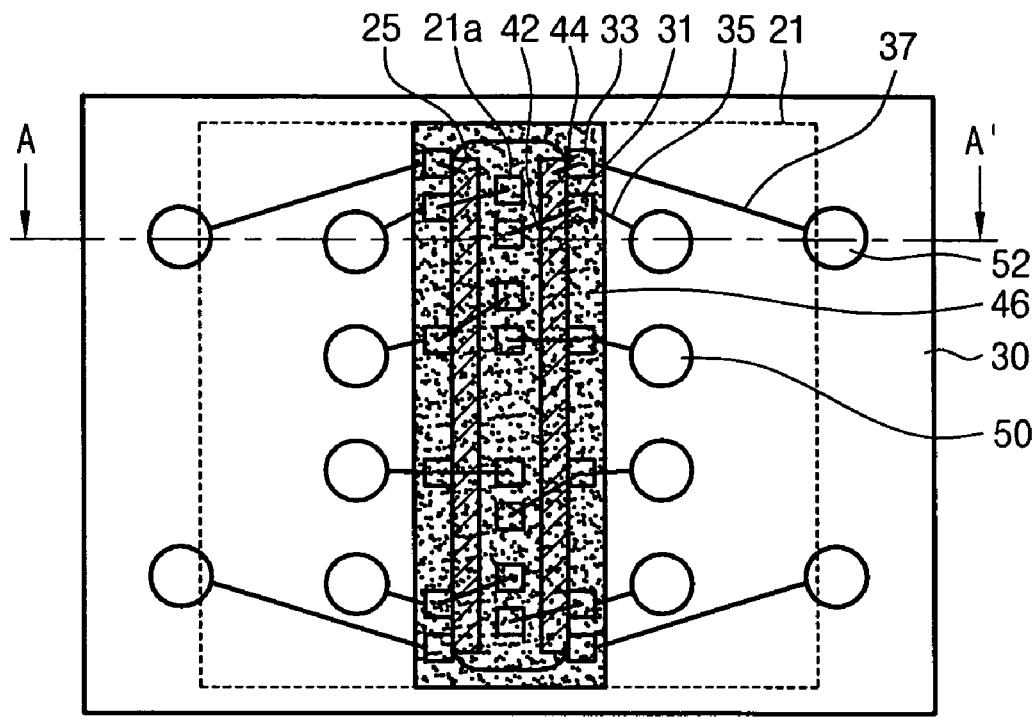
Figure 4C:
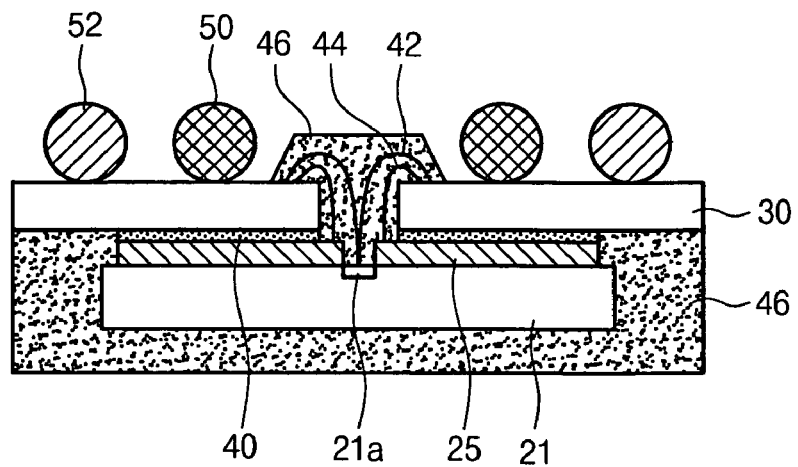

Referring to FIGS. 3c and 4c, the semiconductor chip 21 having the above-mentioned structure is attached to the other side of the substrate 30 including the window in a face-down manner by means of the adhesive tape 40. At this time, the semiconductor chip 21 must be attached to other side of the substrate 30 in such a manner that a predetermined end part of the metal pattern 25 for emitting heat as well as the bonding pad 21a thereof can be exposed through the substrate window.

Herein, the substrate 30 is formed at the center thereof with the window and formed at one side thereof with a plurality of first and second bond fingers 31 and 33 aligned adjacent to the window. Thus, first and second wirings 35 and 37 made from Cu and having first and second ball lands are formed at the other end of the substrate 30. The first bond finger 31 is connected to the bonding pad 21a of the semiconductor chip 21 and the second bond finger 33 is connected to the metal pattern 25 for emitting heat. The number of the first bond fingers 31 is identical to the number of the bonding pads 21a. In contrast, at least two second bond fingers 33, for example, two second bond fingers 33 are located at both sides of the substrate window, respectively, according to the present invention.

In addition, each bonding pad 21a of the semiconductor chip 21 is connected to each first bond finger 31 of the substrate 30 corresponding to the bonding pad 21a by a first metal wire 42 passing through the substrate window. In addition, the metal pattern 25 for emitting heat is connected to the second bond finger 33 of the substrate 30 through a second metal wire 44 passing through the substrate window.

The other side of the substrate 30 including the semiconductor chip 21 and a substrate window portion including first and second metal wires 42 and 44 are sealed by a sealing member 46 including EMC. Subsequently, a first solder ball 50 is attached to an upper surface of a first ball land formed at the other end part of the first wiring 35 connected to the first bond finger 31 in order to allow the semiconductor chip to be mounted on a PCB (not shown). In addition, a second solder ball 52 for emitting heat is attached to an upper surface of a second ball land formed at the other end part of the second wiring 37 connected to the second bond finger 33, thereby completing the manufacturing process of the semiconductor package according to the present invention.

Preferably, the above-mentioned thermal emission path of the semiconductor package according to the present invention is formed in such a manner that the thermal emission path is not electrically shorted with signals and power paths required for operating the semiconductor chip.

As described above, according to the present invention, a metal pattern is formed on a surface of a semiconductor chip in order to use the metal pattern as a thermal emission path, so heat generated during an operation of the semiconductor chip can be rapidly emitted to an exterior, thereby efficiently preventing an operational characteristic of the semiconductor package from being deteriorated due to heat.

Thus, according to the present invention, a thermal emission characteristic can be improved while maintaining the conventional FBGA structure, so it is possible to fabricate a semiconductor package having large capacity with a high operational speed.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A semiconductor package comprising:
    a substrate formed at a center thereof with a window, and formed on one side thereof with a first wiring including a first bond finger and a first ball land and a second wiring including a second bond finger and a second ball land;
    a semiconductor chip attached to an other side of the substrate in a face-down type through an adhesive tape, and provided at a center thereof with a plurality of bonding pads;
    a heat-emission metal pattern formed at a surface of the semiconductor chip, in which the bonding pads are formed, such that the bonding pads are exposed, and formed such that a predetermined portion of the bonding pad adjacent to the heat-emission metal pattern is exposed through a window of the substrate;
    a first metal wire extending by passing through the window of the substrate in order to electrically connect the bonding pad of the semiconductor chip to a first bond finger of the first wiring of the substrate;
    a second metal wire extending by passing through the window of the substrate in order to electrically connect the heat-emission metal pattern to a second bond finger of the second wiring;
    a sealing member for sealing the other side of the substrate including the semiconductor chip and the window of the substrate including the first and second metal wires;
    a first solder ball attached to a first ball land of the first wiring of the substrate in order to allow the semiconductor chip to be mounted on a PCB; and
    a second solder ball attached to an upper surface of the second ball land of the second wiring of the substrate in order to emit heat.

2. The semiconductor package as claimed in claim 1, wherein the heat-emission metal pattern includes a metal having superior thermal conductivity.

3. The semiconductor package as claimed in claim 2, wherein the heat-emission metal pattern includes a multilayer structure having a Cu layer or an Al layer.

4. The semiconductor package as claimed in claim 1, wherein a thickness of the heat-emission metal pattern is about 1~100 µm.

5. The semiconductor package as claimed in claim 1, wherein the heat-emission metal pattern covers the semiconductor chip except for a center portion of the semiconductor chip including the bonding pad.

6. The semiconductor package as claimed in claim 1, wherein the heat-emission metal pattern includes an Ag-plating layer or an Au-plating layer at a predetermined portion thereof to which the second metal wire is connected.

* * * * *